United States Patent
Fujita et al.

(10) Patent No.: US 8,173,037 B2
(45) Date of Patent: May 8, 2012

(54) WAFER POLISH MONITORING METHOD AND DEVICE

(75) Inventors: Takashi Fujita, Mitaka (JP); Toshiyuki Yokoyama, Mitaka (JP); Keita Kitade, Mitaka (JP)

(73) Assignee: Tokyo Semitsu Co. Ltd, Tokyo (JP)

( * ) Notice: Subject to any disclaimer, the term of this patent is extended or adjusted under 35 U.S.C. 154(b) by 1155 days.

(21) Appl. No.: 12/008,350

(22) Filed: Jan. 10, 2008

(65) Prior Publication Data
US 2008/0242197 A1  Oct. 2, 2008

(30) Foreign Application Priority Data
Mar. 29, 2007  (JP) .................. 2007-088404

(51) Int. Cl.
*H01L 21/302* (2006.01)
(52) U.S. Cl. .............. 216/84; 216/89; 257/E21.528; 257/E21.529; 438/692
(58) Field of Classification Search .............. None
See application file for complete search history.

(56) References Cited

U.S. PATENT DOCUMENTS
2006/0164104 A1* 7/2006 Tada et al. ............ 324/646
2006/0274326 A1* 12/2006 Kobayashi et al. ....... 356/600

FOREIGN PATENT DOCUMENTS
| JP | 07-052032 | 2/1995 |
| JP | 08-210833 | 8/1996 |
| JP | 2005-011977 | 1/2005 |
| WO | WO2004113020 | * 12/2004 |

* cited by examiner

*Primary Examiner* — Lan Vinh
*Assistant Examiner* — Jiong-Ping Lu
(74) *Attorney, Agent, or Firm* — Fattibene & Fattibene LLC; Paul A. Fattibene

(57) ABSTRACT

A wafer polish monitoring method and device for detecting the end point of the polishing of a conductive film with high precision and accuracy by monitoring the variation of the film thickness of the conductive film without adverse influence of slurry or the like after the film thickness of the conductive film decreases to an extremely small film thickness defined by the skin depth. A high-frequency transmission path is formed in a portion facing the conductive film on the surface of the wafer, the polishing removal state of the conductive film is evaluated based at least on the transmitted electromagnetic waves passing through the high-frequency transmission path or the reflected electromagnetic waves that are reflected without passing through the high-frequency transmission path, and the end point of the polishing removal and the point equivalent to the end point of the polishing removal are detected.

11 Claims, 10 Drawing Sheets

WAFER POLISH MONITORING METHOD AND DEVICE

BACKGROUND OF THE INVENTION

1. Field of the Invention

The present invention relates to a wafer polish monitoring method and device, and more particularly, to a wafer polish monitoring method and device that can detect, with high precision, the end point of the polishing of the conductive film formed on a wafer in a chemical mechanical polishing (CMP) process, or the like.

2. Description of the Related Art

An oxide film, for example, is formed on the surface of a semiconductor wafer, and a groove pattern equivalent to a wiring pattern is formed by processing the oxide film by lithography or an etching technique. A conductive film made of Cu or the like is formed thereon to fill the groove pattern. The unnecessary portion of the conductive film is then removed by CMP, so as to form the wiring pattern. This process is a well known process. In the formation of the wiring pattern or the like, it is critical to detect the end point of the polishing with precision and stop the polishing when an appropriate thickness of the unnecessary portion of the conductive film is removed.

As a conventional technique related to the above process, there have been known the following wafer polishing method and device lithography. In a polishing device according to this conventional technique, a platen having a polishing pad attached thereto is rotated, and slurry is supplied onto the polishing pad. While the slurry being supplied, a wafer held by a wafer supporting plate is rotated by the wafer supporting plate, and is pressed against the polishing pad. In this manner, the wafer is polished in this polishing device. More specifically, a groove extending from a point near the center point to a point near the outer periphery is formed in the upper face of the platen, and a through hole widening conically downwards, is formed substantially at the center in the longitudinal direction of the groove. A transparent window member for preventing slurry leakage is embedded in the groove side of the through hole.

A probe is provided on the lower face side of the platen. Light is emitted onto the polished face of the wafer facing the rotating path of the transparent window member, and the probe receives the light reflected by the polished face of the wafer. One end of the probe is connected to an optical cable, and the other end is divided into two ends that are connected to a spectral reflectometer device and a measurement light source. Light is emitted from the measurement light source onto the polished face of the wafer, and the reflected light is introduced into the spectral reflectometer device. The spectral reflection factor with a target film thickness is calculated in advance, and the time when the remaining layer has a desired film thickness is detected when the measured spectral reflection factor becomes equal to the calculated value (see Japanese Patent Application Laid-open (JP-A) No. 7-52032, for example).

There are other known conventional techniques such as the following techniques (a) through (c). (a) Ultrasonic waves of a predetermined oscillating frequency are emitted in a pulse-like fashion in predetermined cycles, and the change in film thickness is measured based on the waves reflected by the surface of the wafer and the interference waves with the waves reflected by the bottom face of the wafer. In this manner, the end point of the polishing process is detected (see JP-A-8-210833, for example).

(b) Electromagnetic waves are supplied to the polishing agent slurry waste, and the resonant frequency and the resonant voltage generated by the waves are measured. Based on the measurement results, the end point of the chemical mechanical polishing process is detected (see JP-A-2002-317826, for example).

(c) The pressure applied to each substrate region is adjusted based on the measurement information about the film thickness of the substrate measured by a film thickness measurement device. The film thickness measurement device is a sensor that utilizes overcurrent, optics, temperature, torque current, microwaves, or the like. However, a sensor utilizing microwaves serves as a film thickness measurement device that measures the film thickness of a Cu film or a barrier film as a conductive film formed on a substrate such as a semiconductor wafer, or the film thickness of an oxide film or the like as an insulating film, using a reflection signal of microwaves alone or a combination of suitable signals (see JP-A-2005-11977, for example).

In accordance with the conventional technique disclosed in JP-A-7-52032, the light reflected by the polished face of the wafer pressed against the polishing pad is introduced into a spectral reflectometer device, and the end point of the polishing is detected based on the spectral reflection factor. However, this method has the problem of reflected light scattering due to the slurry. As a result, the signal-to-noise ratio is poor, and it is difficult to detect the end point of each polishing process with precision.

In accordance with the conventional technique disclosed in JP-A-8-210833, a high-frequency oscillator is provided, however, this high-frequency oscillator supplies a high-frequency signal to an ultrasonic vibrator. Therefore, this high-frequency oscillator is not close to or is not related to the technique in accordance with the present invention for detecting the states before and after the removal of a conductive film formed on a wafer, utilizing the characteristics of transmission and reflection of high-frequency electromagnetic waves with respect to the wafer having the conductive film.

In accordance with the conventional technique disclosed in JP-A-2002-317826, electromagnetic radiation is disclosed. However, this disclosure is not close to or is not related to the technique in accordance with the present invention, as in the case described above.

In accordance with the conventional technique disclosed in JP-A-2005-11977, the film thickness of a conductive film on a substrate and the film thickness of an insulating film are measured with the use of microwaves or the like. However, the present invention differs from the conventional technique disclosed in JP-A-2005-11977 in the following aspects. By the conventional technique disclosed in JP-A-2005-11977, a film thickness with respect to a conductive film is not measured or cannot be measured with precision. Rather, the obvious difference between the waveform observed when a conductive film exists and the waveform observed when the conductive film is removed is utilized. Accordingly, if the end point is set at the time when the conductive film is removed, the end point is detected. Although the use of microwaves is disclosed, the JP-A-2005-11977 does not mention a specific frequency of the microwaves. Therefore, it is not clear whether the characteristics of microwaves are utilized, and there is not a specific disclosure about which features are to be utilized as opposed to electromagnetic waves including general light, and what kind of structure is to be used for the measurement. Furthermore, there is not a clear definition of "reflection of microwaves". For example, there is not a disclosure about the fact that the transmission and reflection states are changed as the characteristic impedance is varied by the existence of a conductive film on the wafer in the formation of a high-frequency transmission line for transmitting microwaves. As an example method, a microstrip line serving as a high-frequency transmission line extending along a wafer is provided, as disclosed in the present invention. In the description, it is defined that electromagnetic waves that pass through the microstrip line are set as transmitted electromagnetic waves, and electromagnetic waves that are reflected due to impedance mismatching without entering the high-frequency transmission line are set as reflected electromagnetic waves. Also, there is another method that a transmission antenna and a reception antenna are prepared, so as to perform evaluations based on the signal intensity between the two antennas. However, any of those methods is not disclosed in JP-A-2005-11977. Therefore, it is reasonable to say that the microwaves disclosed in JP-A-2005-11977 may be regarded as electromagnetic waves including general light. Also, in accordance with the present invention, a film thickness exceeding a skin depth is not to be measured, and the states before and after the removal of the conductive film on a wafer are detected with high precision, based on the large difference between the transmission and reflection characteristics of electromagnetic waves between a conductive film and a nonconductive film. Accordingly, the present invention greatly differs from the conventional technique, in terms of the structure, actions, and effects.

SUMMARY OF THE INVENTION

Therefore, the present invention aims to solve the above technical problems, so as to detect the endpoint of the polishing of a conductive film with high precision and accuracy by monitoring the variation of the film thickness of the conductive film without adverse influence of slurry or the like after the film thickness of the conductive film decreases to an extremely small film thickness defined by the skin depth.

The invention has been proposed in order to achieve the above object, and according to a first aspect of the invention, there is provided a wafer polish monitoring method to be utilized in a processing device that carries out a flattening process while polishing and removing a conductive film on a surface of a wafer, the method including the steps of: forming a high-frequency transmission path in a portion facing the surface of the wafer; evaluating a polishing removal state of the conductive film based at least on transmitted electromagnetic waves passing through the high-frequency transmission path or reflected electromagnetic waves that are reflected without passing through the high-frequency transmission path; and detecting an end point of the polishing removal and a point equivalent to the end point of the polishing removal.

With this structure, in a case where a wafer having a conductive film formed thereon does not exist in the opposite location of the high-frequency transmission path, when electromagnetic waves of the frequency band matching the characteristic impedance of the high-frequency transmission path are supplied to the high-frequency transmission path, most electromagnetic waves pass through the high-frequency transmission path as the transmitted electromagnetic waves, and there are few reflected electromagnetic waves that are reflected without passing through the transmission path.

On the other hand, in a case where the conductive film formed on the surface of the wafer is placed near the opposite location of the high-frequency transmission path, the impedance of the transmission path transmitting electromagnetic waves becomes equal to the collective characteristic impedance of the high-frequency transmission path and the conductive film, and the frequency band possibly matched is changed. Accordingly, most of the electromagnetic waves in the frequency band matching only the characteristic impedance of the high-frequency transmission path are reflected without passing through the high-frequency transmission path. Some of the electromagnetic waves as the surface current pass through the outermost layer of the conductive film in the region of the skin depth corresponding to the frequency of the electromagnetic waves.

As the polishing of the conductive film progresses through the flattening process, the transmission characteristics and the reflection characteristics of the electromagnetic waves greatly vary with the change in film thickness after the film thickness of the conductive film decreases to the extremely small film thickness defined by the skin depth. Accordingly, based on at least one of the changes in the transmitted electromagnetic waves and the reflected electromagnetic waves, the end point of the polishing removal and the point equivalent to the end point of the polishing removal are detected.

According to a second aspect of the present invention, there is provided a wafer polish monitoring method to be utilized in a processing device that carries out a flattening process while polishing and removing a conductive film on a surface of a wafer, the method including the steps of: forming a high-frequency transmission path in a portion facing the surface of the wafer; placing a first electrode at an input terminal of the high-frequency transmission path, and a second electrode at an output terminal of the high-frequency transmission path; measuring one of S-parameters $S_{11}$ that is a reflection coefficient at the first electrode, and another one of the S-parameters $S_{21}$ that is a transmission coefficient at the second electrode seen from the first electrode; evaluating a polishing removal state of the conductive film based on at least one of $S_{11}$ and $S_{21}$; and detecting an end point of the polishing removal and a point equivalent to the end point of the polishing removal.

With this structure, as the polishing of the conductive film progresses, the reflection coefficient $S_{11}$ and the transmission coefficient $S_{21}$ of the S-parameters greatly vary with the change in the film thickness after the film thickness of the conductive film decreases to the extremely small film thickness defined by the skin depth. Accordingly, $S_{11}$ and $S_{21}$ are measured, and the end point of the polishing removal and the point equivalent to the end point of the polishing removal are detected based on at least one of the changes in $S_{11}$ and $S_{21}$.

According to a third aspect of the present invention, there is provided a wafer polish monitoring method to be utilized in a processing device that carries out a flattening process while polishing and removing a conductive film on a surface of a wafer, the method including the steps of: forming a high-frequency transmission path in a portion facing the surface of the wafer; measuring indexes including a transmission coefficient, a reflection coefficient, a dielectric constant, and a loss coefficient with respect to the high-frequency transmission path; evaluating a polishing removal state of the conductive film based on at least one of the transmission coefficient, the reflection coefficient, the dielectric constant, and the loss coefficient; and detecting an endpoint of the polishing removal and a point equivalent to the end point of the polishing removal.

In this structure, if a multilayer interconnection structure or the like is formed on the wafer, a conductive film and an insulating film of other materials are normally stacked on the surface of the wafer, and the conductive film to be polished and removed is placed on the stacked films. As the polishing of the conductive film progresses in this multilayer structure, the dielectric constant of the stacked films and the loss coefficient including the dielectric loss vary with the change in the film thickness after the film thickness of the conductive film decreases to the extremely small film thickness defined by the skin depth. Accordingly, the dielectric constant and the loss coefficient as well as the transmission coefficient and the reflection coefficient are measured, and the end point of the polishing removal and the point equivalent to the end point of the polishing removal are detected based on at least one of the changes in the transmission coefficient, the reflection coefficient, the dielectric constant, and the loss coefficient.

A fourth aspect of the present invention provides the wafer polish monitoring method, wherein a frequency band of electromagnetic waves to be supplied to the high-frequency transmission path is a microwave band.

In this structure, the skin depth at which the surface current flows through the conductive film is extremely small in the frequency band of the microwave band. The end point of the polishing removal and the point equivalent to the end point of the polishing removal are detected, based on the variations of the indexes such as the transmission coefficient caused by the change in the film thickness after the film thickness of the conductive film decreases to the extremely small film thickness defined by the skin depth.

A fifth aspect of the present invention provides the wafer polish monitoring method, wherein electromagnetic waves to be supplied to the high-frequency transmission path are continuously varied within a predetermined frequency range, and a transmission coefficient equivalent to the transmitted electromagnetic waves and a reflection coefficient equivalent to the reflected electromagnetic waves are measured in the predetermined frequency range.

In this structure, as the polishing of the conductive film progresses, the collective characteristic impedance of the high-frequency transmission path and the conductive film varies with the change in the film thickness after the film thickness of the conductive film decreases to the extremely small film thickness defined by the skin depth. Due to the impedance mismatching caused by the variation of the characteristic impedance, the transmission coefficient and the reflection coefficient in a specific frequency area in the predetermined frequency range greatly vary with the change of the film thickness. Therefore, to detect the end point of the polishing removal, the variations of the transmission coefficient and the reflection coefficient measured in the specific frequency area are used.

A sixth aspect of the present invention provides the wafer polish monitoring method, wherein the high-frequency transmission path is formed with a microstrip line.

In this structure, the high-frequency transmission path is formed with a microstrip line that exhibits fixed characteristic impedance. Accordingly, the variations of the indexes of the transmission characteristics and the reflection characteristics of electromagnetic waves can be stably measured.

A seventh aspect of the present invention provides the wafer polish monitoring method, wherein the processing device is a chemical mechanical polishing device, and the microstrip line is buried in an upper face portion of a platen of the chemical mechanical polishing device.

In this structure, the microstrip line is buried in the upper face portion of the platen facing the surface of the wafer on which polishing and removal are to be performed. Accordingly, the indexes of the transmission characteristics and the likes of electromagnetic waves can be obtained with precision, without a hindrance to the process of polishing and removing the conductive film.

An eighth aspect of the present invention provides the wafer polish monitoring method, wherein a short-circuited state, an open state, and a matched state of input and output terminals of the high-frequency transmission path are set by a measurement system, and calibration is performed in advance, and the transmission coefficient and the reflection coefficient are measured on the high-frequency transmission path after the calibration.

In this structure, the correction coefficient used at the time of calibration is added, by the measurement system, to the measured values of the transmission coefficient and the likes measured on the high-frequency transmission path. Thus, the variations of the indexes such as the transmission coefficient can be measured with precision.

A ninth aspect of the present invention provides the wafer polish monitoring method, wherein the high-frequency transmission path is formed between a transmission antenna connected to a transmitter and a reception antenna connected to a receiver.

In this structure, the characteristic impedance of the high-frequency transmission path formed between a transmission antenna and a reception antenna varies with the change in the film thickness, after the polishing of the conductive film progresses, and the film thickness of the conductive film decreases to the extremely small film thickness defined by the skin depth. Based on this variation, the end point of the polishing removal of the conductive film and the point equivalent to the end point of the polishing removal are detected.

A tenth aspect of the present invention provides the wafer polish monitoring method, wherein profiles of the transmission coefficient and the reflection coefficient are monitored in the predetermined frequency range, and the end point of the polishing removal and the point equivalent to the end point of the polishing removal are detected when at least one of the transmission coefficient and the reflection coefficient exceeds a predetermined threshold value.

In this structure, to detect the end point of the polishing removal based on the variations of the transmission coefficient and the reflection coefficient measured in the specific frequency area in the predetermined frequency range, the variation profiles of the transmission coefficient and the likes measured in the specific frequency area are monitored. The point where a measured value of the transmission coefficient and the likes exceeds a predetermined threshold value is detected as the end point of the polishing removal.

An eleventh aspect of the present invention provides the wafer polish monitoring method, wherein the transmission coefficient and the reflection coefficient are measured at predetermined two frequencies, and the end point of the polishing removal and the point equivalent to the end point of the polishing removal are detected when at least one of the measured values of the transmission coefficient and the reflection coefficient exceeds a predetermined reference condition.

In this structure, to detect the end point of the polishing removal based on the variations of the transmission coefficient and the reflection coefficient measured in the specific frequency area in the predetermined frequency range, sufficient variations of the transmission coefficient and the likes for detecting the end point of the polishing removal can be obtained at predetermined two frequencies within the predetermined frequency range.

A twelfth aspect of the present invention provides the wafer polish monitoring method, wherein a rate of change of the transmission coefficient and a rate of change of the reflection coefficient both with respect to predetermined reference conditions are measured at predetermined two frequencies, and the end point of the polishing removal and the point equivalent to the end point of the polishing removal are detected when at least one of the measured rates of changes of the transmission coefficient and the reflection coefficient exceeds a predetermined reference rate of change.

In this structure, to detect the endpoint of the polishing removal based on the transmission coefficient and the reflection coefficient measured at the two frequencies in the specific frequency area in the predetermined frequency range, the end point of the polishing removal can also be detected when the point where the rate of change of the transmission coefficient or the like with respect to the predetermined reference condition exceeds the predetermined reference rate of change.

According to a thirteenth aspect of the present invention, there is provided a wafer polish monitoring device to be used in a processing device that carries out a flattening process while polishing and removing a conductive film on a surface of a wafer, wherein the device is configured that a high-frequency transmission path that is formed in a portion facing the surface of the wafer, a polishing removal state of the conductive film is evaluated based at least on transmitted electromagnetic waves passing through the high-frequency transmission path or reflected electromagnetic waves that are reflected without passing through the high-frequency transmission path, and an end point of the polishing removal and a point equivalent to the end point of the polishing removal being detected.

In this structure, the transmission characteristics and the reflection characteristics of the electromagnetic waves greatly vary with the change in film thickness after the film thickness of the conductive film decreases to the extremely small film thickness defined by the skin depth. Accordingly, based on at least one of the changes in the transmitted electromagnetic waves and the reflected electromagnetic waves, the end point of the polishing removal and the point equivalent to the end point of the polishing removal are detected.

A fourteenth aspect of the present invention provides the wafer polish monitoring device, wherein a frequency band of electromagnetic waves to be supplied to the high-frequency transmission path is a microwave band.

In this structure, the skin depth at which the surface current flows through the conductive film is extremely thin in the frequency band of the microwave band. The end point of the polishing removal is detected based on the variations of the indexes such as the transmission coefficient caused by the change in the film thickness after the film thickness of the conductive film decreases to the extremely small film thickness defined by the skin depth.

A fifteenth aspect of the present invention provides the wafer polish monitoring device, wherein the high-frequency transmission path is formed with a microstrip line.

In this structure, the high-frequency transmission path is formed with a microstrip line that exhibits specific characteristic impedance. Accordingly, the variations of the indexes of the transmission characteristics and the reflection characteristics of electromagnetic waves can be stably measured.

A sixteenth aspect of the present invention provides the wafer polish monitoring device, wherein the processing device is a chemical mechanical polishing device, and the microstrip line is buried in an upper face portion of a platen of the chemical mechanical polishing device.

In this structure, the microstrip line is buried in the upper face portion of the platen facing the surface of the wafer on which polishing and removal are to be performed. Accordingly, the indexes of the transmission characteristics and the likes of electromagnetic waves can be obtained with precision, without a hindrance to the process of polishing and removing the conductive film.

A seventeenth aspect of the present invention provides the wafer polish monitoring device, wherein the microstrip line is formed with a strip conductor that is supported on a ground plane via a dielectric material, the strip conductor lying parallel to the ground plane.

In this structure, the microstrip line can be readily formed and can be made small. Also, the small-sized microstrip line can be easily buried in the upper face portion of the platen.

An eighteenth aspect of the present invention provides the wafer polish monitoring device, wherein a dielectric material in the microstrip line is Teflon (a registered trade name), epoxy, or Bakelite.

In this structure, the characteristic impedance of the microstrip line can be easily determined, and the high-frequency loss can be restricted to a small amount.

A nineteenth aspect of the present invention provides the wafer polish monitoring device, wherein the high-frequency transmission path is formed with a cavity resonator.

In this structure, the volume or the like of the cavity portion of the cavity resonator forming the high-frequency transmission path is arbitrarily adjusted to change the resonant frequency, and the collective characteristic impedance of the cavity resonator and the film condition of the conductive film can be markedly varied. Accordingly, as the polishing of the conductive film progresses, the transmission coefficient, the reflection coefficient, and the loss coefficient can be greatly varied with the change in the film thickness after the film thickness of the conductive film decreases to the extremely small film thickness defined by the skin depth. Based on the variations of those coefficients, the end point of the polishing removal of the conductive film and the point equivalent to the end point of the polishing removal are detected.

A twentieth aspect of the present invention provides the wafer polish monitoring device, wherein the cavity resonator is capable of changing a resonant frequency by changing at least either the volume or shape of a cavity portion.

In this structure, at least either the volume or the shape of the cavity portion of the cavity resonator is adjusted, so that the resonant frequency can be easily varied.

A twenty-first aspect of the present invention provides the wafer polish monitoring device, wherein an upper face of the cavity resonator is covered with a nonconductor material.

In this structure, the upper face of the cavity resonator is covered with a nonconductive member, so that the upper face of the cavity resonator is open with respect to electromagnetic waves. When there is not a wafer having a conductive film formed thereon, the electromagnetic waves entering the cavity resonator are transmitted and radiated through the cavity resonator. If only there is a wafer having a conductive film formed thereon, the film condition of the conductive film is monitored.

A twenty-second aspect of the present invention provides the wafer polish monitoring device, wherein the high-frequency transmission path is formed between a transmission antenna connected to a transmitter and a reception antenna connected to a receiver.

In this structure, the characteristic impedance of the high-frequency transmission path formed between a transmission antenna and a reception antenna varies with the change in the film thickness, after the polishing of the conductive film progresses, and the film thickness of the conductive film decreases to the extremely small film thickness defined by the skin depth. Based on this variation, the end point of the polishing removal of the conductive film and the point equivalent to the end point of the polishing removal are detected.

The first aspect of the invention is a wafer polish monitoring method that includes the steps of: forming a high-frequency transmission path in a position facing the surface of the wafer; evaluating the polishing removal state of the conductive film based at least on the transmitted electromagnetic waves passing through the high-frequency transmission path or the reflected electromagnetic waves that are reflected without passing through the high-frequency transmission path; and detecting the end point of the polishing removal and the point equivalent to the endpoint of the polishing removal. This wafer polish monitoring method has the advantage that the transmission characteristics and the reflection characteristics of the electromagnetic waves greatly vary with the change in film thickness after the polishing of the conductive film progresses and the film thickness of the conductive film decreases to the extremely small film thickness defined by the skin depth, and accordingly, the end point of the polishing removal can be detected with high precision and accuracy, based on at least one of the changes in the transmitted electromagnetic waves and the reflected electromagnetic waves.

The second aspect of the invention is a wafer polish monitoring method that includes the steps of: forming a high-frequency transmission path in a position facing the surface of the wafer; placing a first electrode at the input terminal of the high-frequency transmission path, and a second electrode at the output terminal of the high-frequency transmission path; measuring one of the S-parameters $S_{11}$ that is the reflection coefficient at the first electrode, and another one of the S-parameters $S_{21}$ that is the transmission coefficient at the second electrode seen from the first electrode; evaluating the polishing removal state of the conductive film based on at least one of $S_{11}$ and $S_{21}$; and detecting the end point of the polishing removal and the point equivalent to the end point of the polishing removal. This wafer polish monitoring method has the advantage that, as the polishing of the conductive film progresses, $S_{11}$ and $S_{21}$ of the S-parameters greatly vary with the change in the film thickness after the film thickness of the conductive film decreases to the extremely small film thickness defined by the skin depth, and accordingly, the end point of the polishing removal can be detected with high precision and accuracy, based on at least one of the changes in $S_{11}$ and $S_{21}$.

The third aspect of the invention is a wafer polish monitoring method that includes the steps of: forming a high-frequency transmission path in a position facing the surface of the wafer; measuring the indexes such as the transmission coefficient, the reflection coefficient, the dielectric constant, and the loss coefficient with respect to the high-frequency transmission path; evaluating the polishing removal state of the conductive film based on at least one of the transmission coefficient, the reflection coefficient, the dielectric constant, and the loss coefficient; and detecting the end point of the polishing removal and the point equivalent to the end point of the polishing removal. This wafer polish monitoring method has the advantage that the dielectric constant and the loss coefficient including the dielectric loss vary with the change in the film thickness after the polishing of the conductive film progresses and the film thickness of the conductive film decreases to the extremely small film thickness defined by the skin depth, and accordingly, the end point of the polishing removal can be detected with high precision and accuracy, based on at least one of the changes in the indexes including the transmission coefficient, the reflection coefficient, the dielectric constant, and the loss coefficient.

The fourth aspect of the invention is a wafer polish monitoring method by which the frequency band of electromagnetic waves to be supplied to the high-frequency transmission path is a microwave band. This wafer polish monitoring method has the advantage that, since the skin depth is extremely small in the frequency band of the microwave band, the end point of the polishing removal can be detected with high precision and accuracy, based on the variations of the indexes such as the transmission coefficient caused by the change in the film thickness after the film thickness of the conductive film decreases to the extremely small film thickness defined by the skin depth.

The fifth aspect of the invention is a wafer polish monitoring method by which the electromagnetic waves to be supplied to the high-frequency transmission path are continuously varied within a predetermined frequency range, and a transmission coefficient equivalent to the transmitted electromagnetic waves and a reflection coefficient equivalent to the reflected electromagnetic waves are measured in the predetermined frequency range. This wafer polish monitoring method has the advantage that the indexes such as the transmission coefficient greatly vary with the change in the film thickness in a specific frequency area within the predetermined frequency range after the film thickness of the conductive film decreases to the extremely small film thickness defined by the skin depth, and accordingly, the end point of the polishing removal can be detected with high precision, based on the variations of the indexes such as the transmission coefficient measured in the specific frequency area.

The sixth aspect of the invention is a wafer polish monitoring method by which the high-frequency transmission path is formed with a microstrip line. This wafer polish monitoring method has the advantage that the variations of the indexes of the transmission characteristics and the likes of the electromagnetic waves can be stably measured.

The seventh aspect of the invention is a wafer polish monitoring method by which the processing device is a chemical mechanical polishing device, and the microstrip line is buried in the upper face portion of the platen of the chemical mechanical polishing device. This wafer polish monitoring method has the advantage that the indexes of the transmission characteristics and the likes of electromagnetic waves can be obtained with precision, without a hindrance to the process of polishing and removing the conductive film.

The eighth aspect of the invention is a wafer polish monitoring method by which a short-circuited state, an open state, and a matched state of the input and output terminals of the high-frequency transmission path are set by a measurement system, and calibration is performed in advance, and the transmission coefficient and the reflection coefficient are measured on the high-frequency transmission path after the calibration. This wafer polish monitoring method has the advantage that the variations of the indexes such as the transmission coefficient and the reflection coefficient can be measured with precision.

The ninth aspect of the invention is a wafer polish monitoring method by which the high-frequency transmission path is formed between a transmission antenna connected to a transmitter and a reception antenna connected to a receiver. This wafer polish monitoring method has the advantage that the variations of the transmission coefficient and the reflection coefficient of electromagnetic waves and the likes are caused by the characteristic impedance of the high-frequency transmission path varying with the change in the film thickness after the polishing of the conductive film progresses and the film thickness of the conductive film decreases to the extremely small film thickness defined by the skin depth, and accordingly, the end point of the polishing removal of the conductive film can be detected with precision, based on the variations of those coefficients.

The tenth aspect of the invention is a wafer polish monitoring method by which the profiles of the transmission coefficient and the reflection coefficient in the predetermined frequency range are monitored, and the end point of the polishing removal and the point equivalent to the end point of the polishing removal are detected when at least one of the transmission coefficient and the reflection coefficient exceeds a predetermined threshold value. This wafer polish monitoring method has the advantage that, as the variation profiles of the transmission coefficient and the likes measured are monitored, the point where the measured values of the transmission coefficient and the likes exceeds a predetermined threshold value is determined as the end point of the polishing removal with precision, and accordingly, the end point of the polishing removal of the conductive film can be detected with precision.

The eleventh aspect of the invention is a wafer polish monitoring method by which the transmission coefficient and the reflection coefficient are measured at predetermined two frequencies, and the end point of the polishing removal and the point equivalent to the end point of the polishing removal are detected when at least one of the measured values of the transmission coefficient and the reflection coefficient exceeds a predetermined reference condition. This wafer polish monitoring method has the advantage that the end point of the polishing removal of the conductive film can be readily detected with high precision, based on the indexes such as the transmission coefficient and the likes measured at the predetermined two frequencies.

The twelfth aspect of the invention is a wafer polish monitoring method by which the rate of change of the transmission coefficient and the rate of change of the reflection coefficient both with respect to predetermined reference conditions are measured at predetermined two frequencies, and the end point of the polishing removal and the point equivalent to the end point of the polishing removal are detected when at least one of the measured rates of changes of the transmission coefficient and the reflection coefficient exceeds a predetermined reference rate of change. This wafer polish monitoring method has the advantage that, to detect the end point of the polishing removal based on the indexes such as the transmission coefficient measured at the predetermined two frequencies, the end point of the polishing removal can also be detected with high precision when the point where the rate of change of the transmission coefficient or the like with respect to the predetermined reference condition exceeds the predetermined reference rate of change.

The thirteenth aspect of the invention is a wafer polish monitoring device to be used in a processing device that carries out a flattening process while polishing and removing a conductive film on the surface of a wafer. This wafer polish monitoring device is configured that a high-frequency transmission path that is formed in a position facing the surface of the wafer, the polishing removal state of the conductive film is evaluated based at least on the transmitted electromagnetic waves passing through the high-frequency transmission path or the reflected electromagnetic waves that are reflected without passing through the high-frequency transmission path, and the end point of the polishing removal and the point equivalent to the endpoint of the polishing removal are detected. This wafer polish monitoring device has the advantage that the transmission characteristics and the reflection characteristics of the electromagnetic waves greatly vary with the change in film thickness after the polishing of the conductive film progresses and the film thickness of the conductive film decreases to the extremely small film thickness defined by the skin depth, and accordingly, the end point of the polishing removal can be detected with high precision and accuracy, based on at least one of the changes in the transmitted electromagnetic waves and the reflected electromagnetic waves.

The fourteenth aspect of the invention is a wafer polish monitoring device in which the frequency band of the electromagnetic waves to be supplied to the high-frequency transmission path is a microwave band. This wafer polish monitoring device has the advantage that the skin depth is extremely thin in the frequency band of the microwave band, and accordingly, the end point of the polishing removal can be detected with high precision and accuracy, based on the variations of the indexes such as the transmission coefficient caused by the change in the film thickness after the film thickness of the conductive film decreases to the extremely small film thickness defined by the skin depth.

The fifteenth aspect of the invention is a wafer polish monitoring device in which the high-frequency transmission path is formed with a microstrip line. This wafer polish monitoring device has the advantage that the variations of the indexes such as the transmission characteristics of the electromagnetic waves can be stably measured.

The sixteenth aspect of the invention is a wafer polish monitoring device in which the processing device is a chemical mechanical polishing device, and the microstrip line is buried in the upper face portion of the platen of the chemical mechanical polishing device. This wafer polish monitoring device has the advantage that the indexes of the transmission characteristics and the likes of the electromagnetic waves can be obtained with precision, without a hindrance to the process of polishing and removing the conductive film.

The seventeenth aspect of the invention is a wafer polish monitoring device in which the microstrip line is formed with a strip conductor that is supported on a ground plane via a dielectric material, and the strip conductor lies parallel to the ground plane. This wafer polish monitoring device has the advantage that the microstrip line can be readily formed and can be made small, and the small-sized microstrip line can be easily buried in the upper face portion of the platen.

The eighteenth aspect of the invention is a wafer polish monitoring device in which the dielectric material in the microstrip line is Teflon (a registered trade name), epoxy, or Bakelite. This wafer polish monitoring device has the advantage that the characteristic impedance of the microstrip line can be easily determined, and the high-frequency loss can be restricted to a small amount.

The nineteenth aspect of the invention is a wafer polish monitoring device in which the high-frequency transmission path is formed with a cavity resonator. In this wafer polish monitoring device, the transmission coefficient, the reflection coefficient, and the loss coefficient can be greatly varied with the change in the film thickness after the polishing of the conductive film progresses and the film thickness of the conductive film decreases to the extremely small film thickness defined by the skin depth. Accordingly, this wafer polish monitoring device has the advantage that the end point of the polishing removal of the conductive film can be detected with high precision and accuracy, based on the variations of those coefficients.

The twentieth aspect of the invention is a wafer polish monitoring device in which the cavity resonator is capable of changing the resonant frequency by changing the volume or shape of the cavity portion. This wafer polish monitoring device has the advantage that the resonant frequency of the cavity resonator can be arbitrarily adjusted, and accordingly, the transmission coefficient, the reflection coefficient, and the loss coefficient can be greatly varied with the change in the film thickness after the polishing of the conductive film progresses and the film thickness of the conductive film decreases to the extremely small film thickness defined by the skin depth.

The twenty-first aspect of the invention is a wafer polish monitoring device in which the upper face of the cavity resonator is covered with a nonconductor material. This wafer polish monitoring device has the advantage that, only when there is a wafer having a conductive film formed thereon, the film condition of the conductive film is monitored with precision, and the variations of the required coefficients such as the transmission coefficient and the reflection coefficient of the electromagnetic waves can be obtained.

The twenty-second aspect of the invention is a wafer polish monitoring device in which the high-frequency transmission path is formed between a transmission antenna connected to a transmitter and a reception antenna connected to a receiver. In this wafer polish monitoring device, the variations of the coefficients such as the transmission coefficient and the reflection coefficient of the electromagnetic waves are caused by the characteristic impedance of the high-frequency transmission path varying with the change in the film thickness, after the polishing of the conductive film progresses and the film thickness of the conductive film decreases to the extremely small film thickness defined by the skin depth. Accordingly, this wafer polish monitoring device has the advantage that the end point of the polishing removal of the conductive film can be detected with precision, based on the variations of those coefficients.

BRIEF DESCRIPTION OF THE DRAWINGS

FIG. 4B shows an example of characteristic variations of the transmission coefficient and the reflection coefficient as the frequency varies in the microwave band in the wafer having the conductive film, when the wafer is formed with a Ta film or the like;

DESCRIPTION OF THE PREFERRED EMBODIMENTS

In order to accomplish an objective of detecting the end point of the polishing of a conductive film with high precision and accuracy by monitoring the variation of the film thickness of the conductive film without adverse influence of slurry or the like after the film thickness of the conductive film decreases to an extremely small film thickness defined by the skin depth, a wafer polish monitoring method is provided to be utilized in a processing device that carries out a flattening process while polishing and removing the conductive film on the surface of a wafer. The objective is achieved by the method including the steps of: forming a high-frequency transmission path formed with a microstrip line in a portion facing the surface of the wafer, evaluating the polishing removal state of the conductive film based at least on the transmitted electromagnetic waves passing through the high-frequency transmission path or the reflected electromagnetic waves that are reflected without passing through the high-frequency transmission path, and detecting the end point of the polishing removal and the point equivalent to the end point of the polishing removal.

First Embodiment

Figure 1:
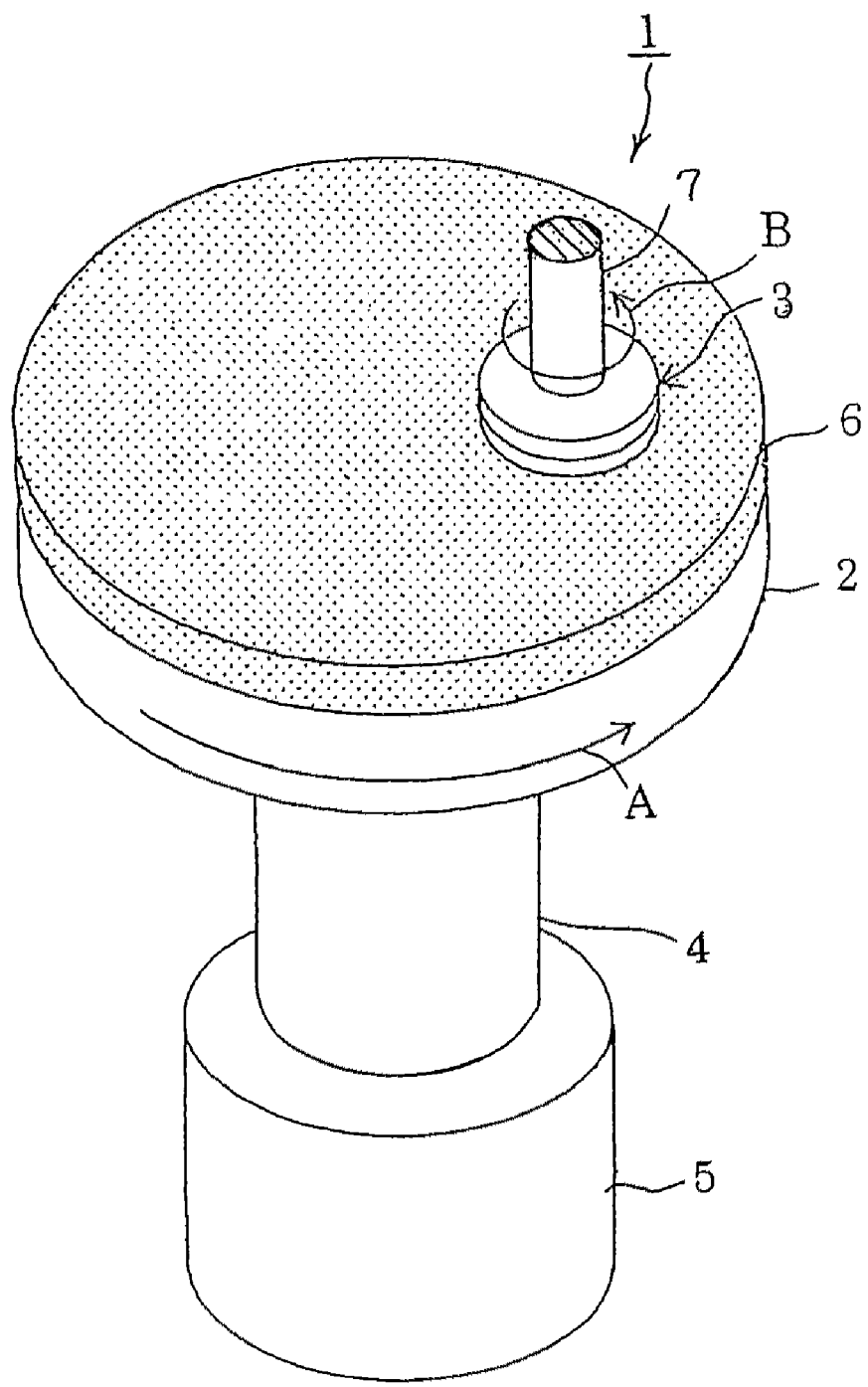
FIG. 1 is a perspective view of a chemical mechanical polishing device having a microstrip line mounted therein.
Figure 2:
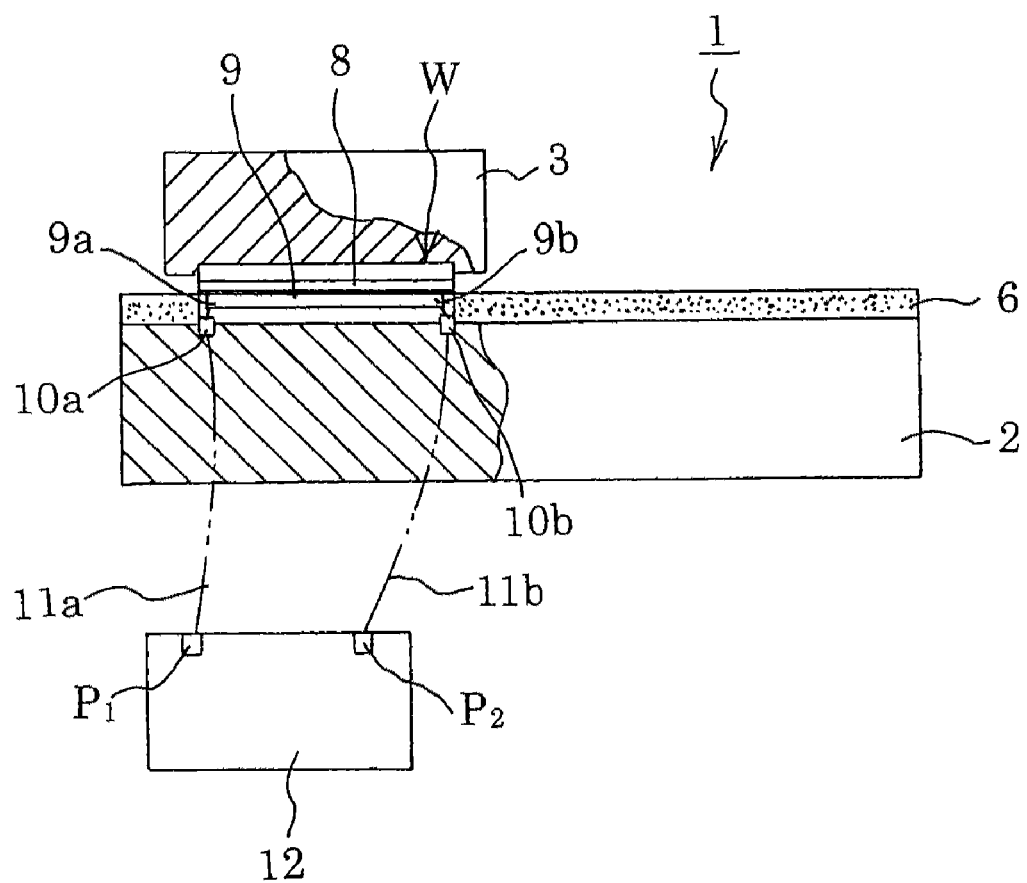
FIG. 2 is a configuration diagram illustrating the connection between the microstrip line mounted in the upper face portion of the platen and a network analyzer.

The following is a description of a preferred embodiment of the present invention, with reference to the accompanying drawings. FIG. 1 is a perspective view of a chemical mechanical polishing device equipped with a microstrip line. FIG. 2 is a configuration diagram illustrates the connection between the microstrip line mounted on the upper face portion of the platen and a network analyzer.

First, the wafer polish monitoring method and a configuration of the device in accordance with this embodiment are described, with a chemical mechanical polishing device as a processing device being taken as an example. In FIG. 1, a chemical mechanical polishing device 1 mainly includes a platen 2 and a polishing head 3.

The platen 2 is formed in a disk-like form. A rotation axis 4 is connected to the center of the bottom face of the platen 2, and the platen 2 rotates in the direction indicated by an arrow A when a motor 5 is driven. A polishing pad 6 is bonded onto the upper face of the platen 2, and slurry that is a mixture of a polishing agent and a chemical agent is supplied onto the polishing pad 6 from a nozzle (not shown).

The polishing head 3 has a body in a disk-like form. A rotation axis 7 is connected to the center of the upper face of the polishing head 3, and the polishing head 3 rotates in the direction of an arrow B when a motor (not shown) is driven.

In the chemical mechanical polishing device, the polishing head 3 sucks and holds a wafer having a conductive film formed thereon. The wafer is then transported onto the platen 2 by a moving mechanism (not shown). The wafer is placed onto the platen 2, so that the conductive film is in contact with the polishing pad 6. An air bag (not shown) provided in the polishing head 3 is then filled with air and is inflated. The conductive film on the surface of the wafer is pressed against the polishing pad 6 by virtue of the pressure from the air bag.

In this state, the platen 2 is rotated in the direction of the arrow A of FIG. 1, and the polishing head 3 is rotated in the direction of the arrow B of FIG. 1. Slurry is then supplied onto the rotating polishing pad 6 from the nozzle (not shown), so as to polish the conductive film formed on the surface of the wafer.

As shown in FIG. 2, in the chemical mechanical polishing device 1, a microstrip line 9 to serve as a high-frequency transmission path is embedded in a portion of the upper face of the platen 2 that faces a conductive film 8 on the surface of a wafer W held by the polishing head 3. The microstrip line 9 has a length equivalent to the diameter of the wafer W. A high-frequency transmission path is formed with the microstrip line 9, and the microstrip line 9 is buried in the upper face portion of the platen 2. With this arrangement, the polishing and removing the conductive film 8 are not hindered, and the indexes of the transmission characteristics and the likes of electromagnetic waves can be obtained with precision.

The microstrip line 9 may be buried in the surface portion of the body of the platen 2 on the backside of the polishing pad 6 that faces the conductive film 8 on the surface of the wafer W. However, if an opening of the size equivalent to the outline of the microstrip line 9 is cut in the polishing pad 6, and the microstrip line 9 is embedded in the opening as shown in FIG. 2, the microstrip line 9 can be set closer to the conductive film 8 and the indexes can be obtained with higher precision.

The microstrip line 9 is formed with a strip conductor that is supported on a ground plane (not shown) via a dielectric material such as Teflon (a registered trade name), epoxy, or Bakelite. The strip conductor is supported parallel to the ground plane. Having this structure, the microstrip line 9 can be made simple and small, and can be easily embedded in the upper face portion of the platen 2. Also, the characteristic impedance of the high-frequency transmission path is determined, and changes in the indexes of the transmission characteristics, reflection characteristics, and the likes of electromagnetic waves can be measured with precision.

An input terminal 9a and an output terminal 9b are provided in the microstrip line 9. A first electrode 10a connected to the input terminal 9a is inserted to a spot of the upper portion of the platen 2. The spot corresponds to the input terminal 9a of the microstrip line 9. A second electrode 10b connected to the output terminal 9b is inserted to a spot of the upper portion of the platen 2. The spot corresponds to the output terminal 9b.

The first electrode 10a is connected to a port $P_1$ of a network analyzer 12 that is a measurement system, via a coaxial cable 11a and a rotational connecting means such as a slip ring (not shown). The second electrode 10b is connected to a port $P_2$ of the network analyzer 12 via a coaxial cable 11b and the same rotational connecting means as above (not shown).

The network analyzer 12 may be Vector Network Analyzer (Model No. 3724G, manufactured by Anritsu Corporation), for example. The network analyzer 12 has the functions of a special-purpose central processor, and can measure the transmission characteristics and reflection characteristics of electromagnetic waves, and dielectric constants and loss coefficients of measurement samples.

The reflected electromagnetic waves that are reflected without passing through the microstrip line 9 among the electromagnetic waves emitted from the port $P_1$ of the network analyzer 12 are reflected by the first electrode 10a, and are input to the port $P_1$. Meanwhile, the transmitted electromagnetic waves that pass through the microstrip line 9 are input from the second electrode 10b to the port $P_2$.

Next, the effects of the wafer polish monitoring device having the above structure, and the wafer polish monitoring method are described through "Skin Depth", "Index Measurement by Obtaining S-Parameters", and "Polish End Point Detection by Monitoring Index Variation Profile".

[Skin Depth]

The action principles of this embodiment are based on the skin effect that is caused in a conductor by high-frequency waves. Generally, when high-frequency waves such as microwaves enter a conductor, the high-frequency waves are reflected by the conductor. However, part of the current flows through a portion near the outermost layer of the conductor. This effect is the "skin effect". The depth required for the current flowing in the skin to attenuate to 1/e (e being 2.718) is called the "skin depth". The skin depth δ is expressed by the following equation (1):

$$\delta = \sqrt{\frac{2}{\omega\mu\sigma}} \quad (m) \tag{1}$$

where ω is 2 πf, μ is the magnetic transmission rate, and σ is the electric conductivity.

According to the equation (1), as the frequency f of the high-frequency waves becomes higher, the skin depth δ becomes smaller. Table 1 shows the relationship between the frequency f and the skin depth δ in a case where the conductor is made of copper (Cu) and the relationship between the frequency f and the skin depth δ in a case where the conductor is made of aluminum (Al).

TABLE 1

| Frequency | Skin depth (mm) | |
| --- | --- | --- |
| | Cu | Al |
| 100 Hz | 6.6 | 8.4 |
| 1 kHz | 2.1 | 2.7 |
| 10 kHz | 0.66 | 0.84 |
| 100 kHz | 0.209 | 0.27 |
| 1 MHz | 0.066 | 0.084 |
| 10 MHz | 0.021 | 0.027 |
| 100 MHz | 0.066 | 0.0084 |
| 1 GHz | 0.0021 | 0.0027 |

In a case where the film thickness to be evaluated is equal to or larger than the skin depth δ that is clearly defined by the frequency to be evaluated and the conductivity and transmission rate of the conductive film, the electromagnetic waves do not enter the conductor deeper than the skin depth δ in principle, and therefore, most of the electromagnetic waves are reflected. In cases of low-frequency waves, on the other hand, the skin depth δ is very large, and therefore, most of the electromagnetic waves permeate the conductor. In the process of removing the conductive film, highly precise measurement should be carried out by widely varying the signal waveforms near the end point of the process, and the skin depth δ should be made very thin, as in a case where a Cu film is to be processed by CMP. Therefore, if the frequency is 100 MHz or higher, more preferably 1 GHz or higher, the skin depth δ becomes some microns, and the endpoint detection can be carried out with high precision.

The wafer polish monitoring method in accordance with this embodiment is to evaluate states of the transmission and reflection of electromagnetic waves in the neighborhood of or less of the film thickness of the conductive film defined by the skin depth δ.

[Index Measurement by Obtaining S-Parameters]

Figure 3A:
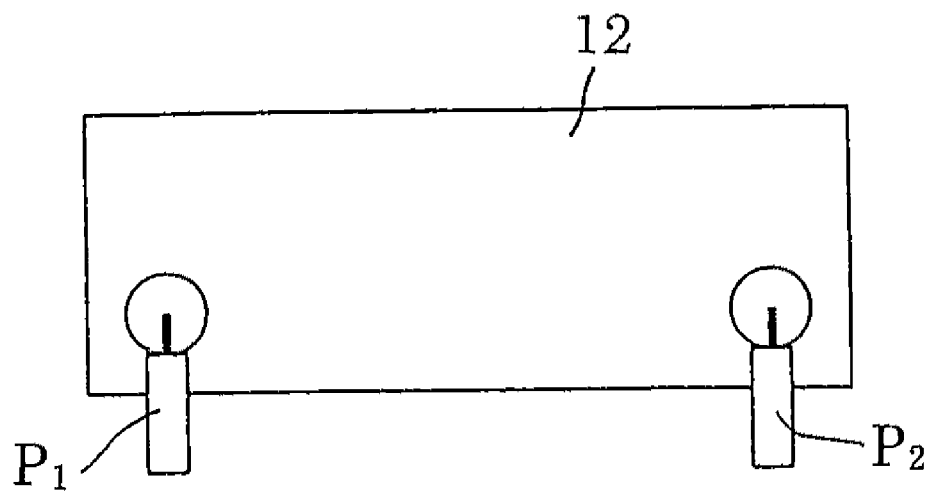
FIG. 3A is a block diagram concerning the network analyzer.
Figure 3B:
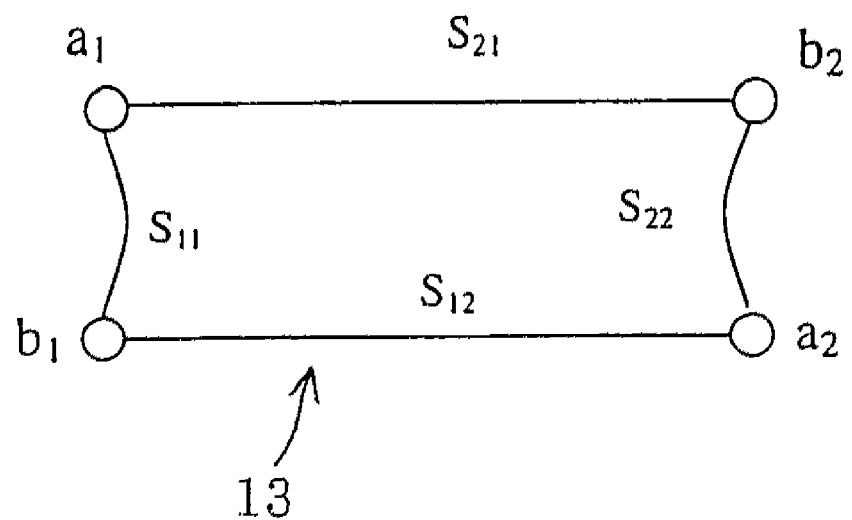
FIG. 3B shows a measurement model of the S-parameters.

FIGS. 3A and 3B illustrate the network analyzer. FIG. 3A is a block diagram, and FIG. 3B shows the measurement model of the S-parameters. An input terminal $a_1$ in a measurement model 13 shown in FIG. 3B is equivalent to the first electrode 10a shown in FIG. 2, and an input terminal $b_1$ is equivalent to the port $P_1$ of the network analyzer 12. An output terminal $b_2$ in the measurement model 13 is equivalent to the second electrode 10b shown in FIG. 2, and an output terminal $a_2$ is equivalent to the port $P_2$ of the network analyzer 12.

The reflection coefficient with respect to the reflected electromagnetic waves is measured with an input terminal reflection coefficient $S_{11}$ of the S-parameters, and the transmission coefficient with respect to the transmitted electromagnetic waves is measured with a forward transmission coefficient $S_{21}$ of the S-parameters. The following procedures (a), (b), and (c) are carried out in the network analyzer 12, so as to calibrate the microstrip line 9.

(a) A resistance of 50Ω, which is the characteristic impedance of the microstrip line 9, is inserted between the port $P_1$ of the network analyzer 12 and the ground level, and the same resistance of 50Ω is inserted between the port $P_2$ and the ground level, so as to create a matched condition. In this matched condition, the S-parameter of the microstrip line 9 is measured, and a correction coefficient is determined by the network analyzer 12.

(b) The resistance of 50Ω, which is applied to both the port $P_1$ and the port $P_2$, is removed, and the two ports are connected to each other, so as to create a short-circuited condition. In this short-circuited condition, the S-parameter of the microstrip line 9 is measured, and a correction coefficient is determined by the network analyzer 12.

(c) The resistance of 50Ω is removed from both the port $P_1$ and the port $P_2$, and the two ports are disconnected from each other, so as to create an open condition. In this open condition, the S-parameter of the microstrip line 9 is measured, and a correction coefficient is determined by the network analyzer 12.

The correction coefficients obtained in the procedures (a), (b), and (c) are stored in the network analyzer 12, and the calibration of the microstrip line 9 by the network analyzer 12 is ended.

After the calibration, the correction coefficients obtained at the time of calibration by the network analyzer 12 are applied to the S-parameters measured by the network analyzer 12, so that changes of the indexes such as the reflection coefficient $S_{11}$ and the transmission coefficient $S_{21}$ and the likes can be accurately measured.

[Polish End Point Detection by Monitoring Index Variation Profile]

Figure 4A:
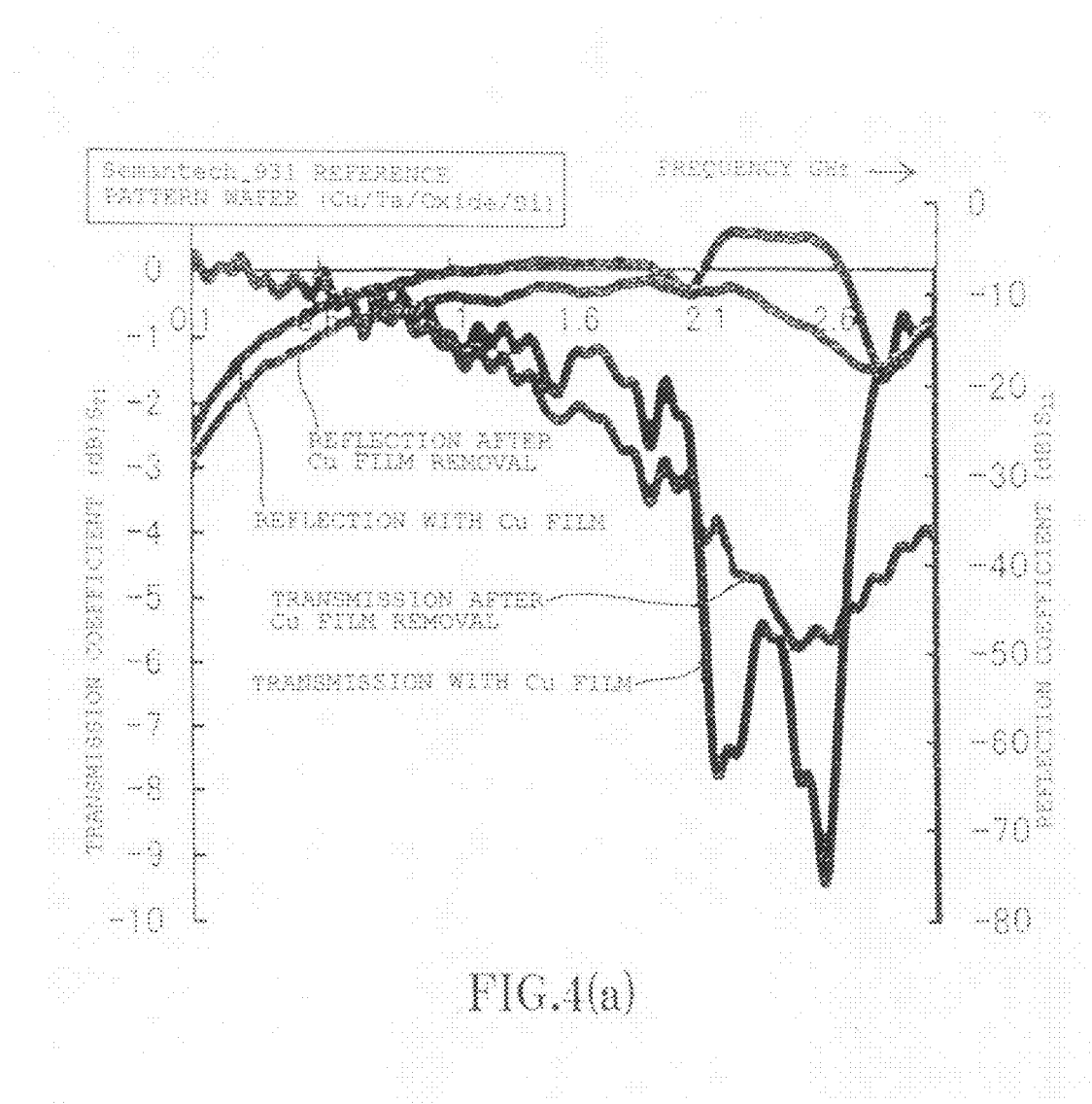
FIG. 4A shows an example of characteristic variations of a transmission coefficient and a reflection coefficient as a frequency varies in a microwave band in a wafer having a conductive film, when the wafer is formed with a Cu film.
Figure 4B:
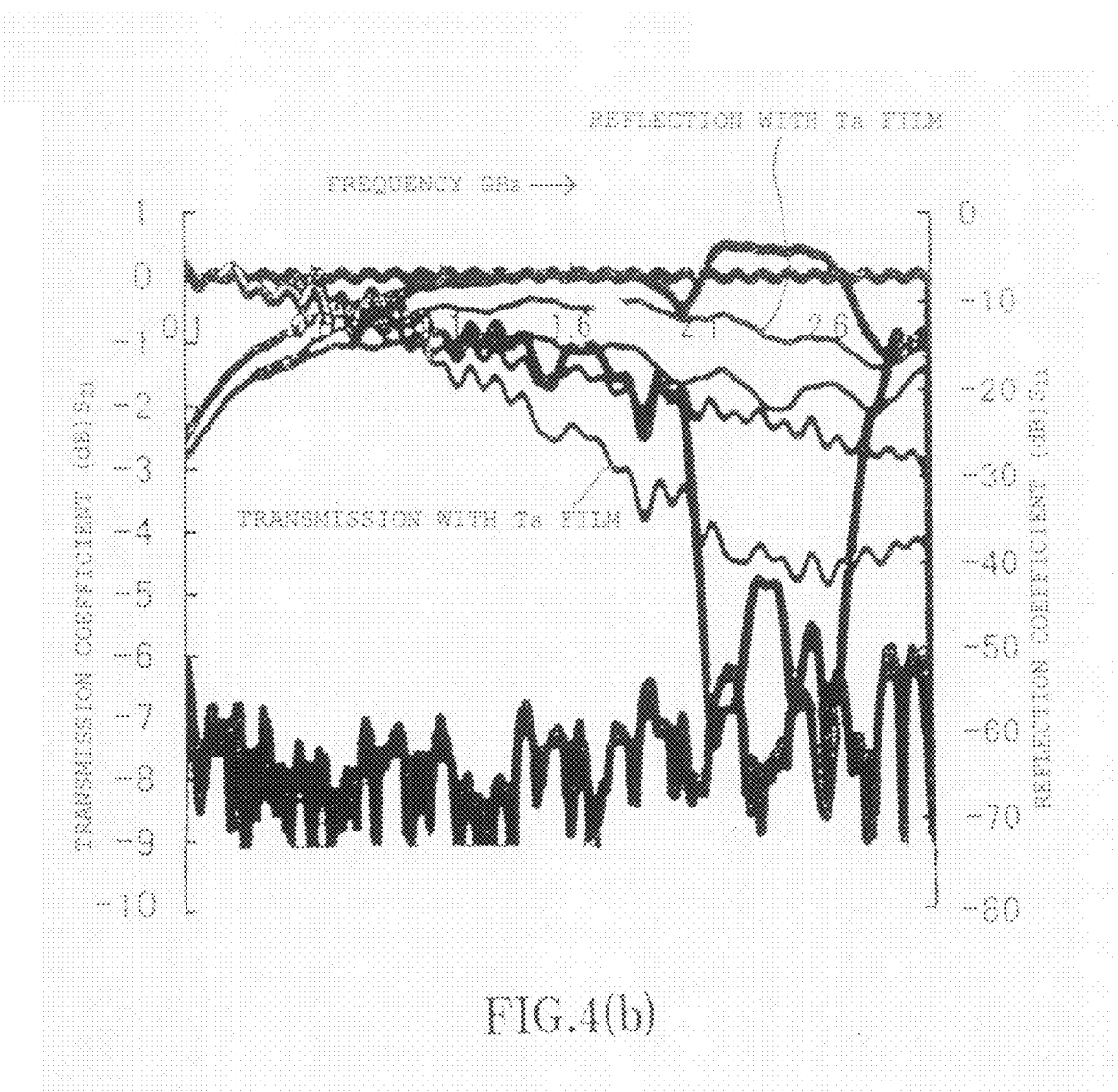
Figure 4C:
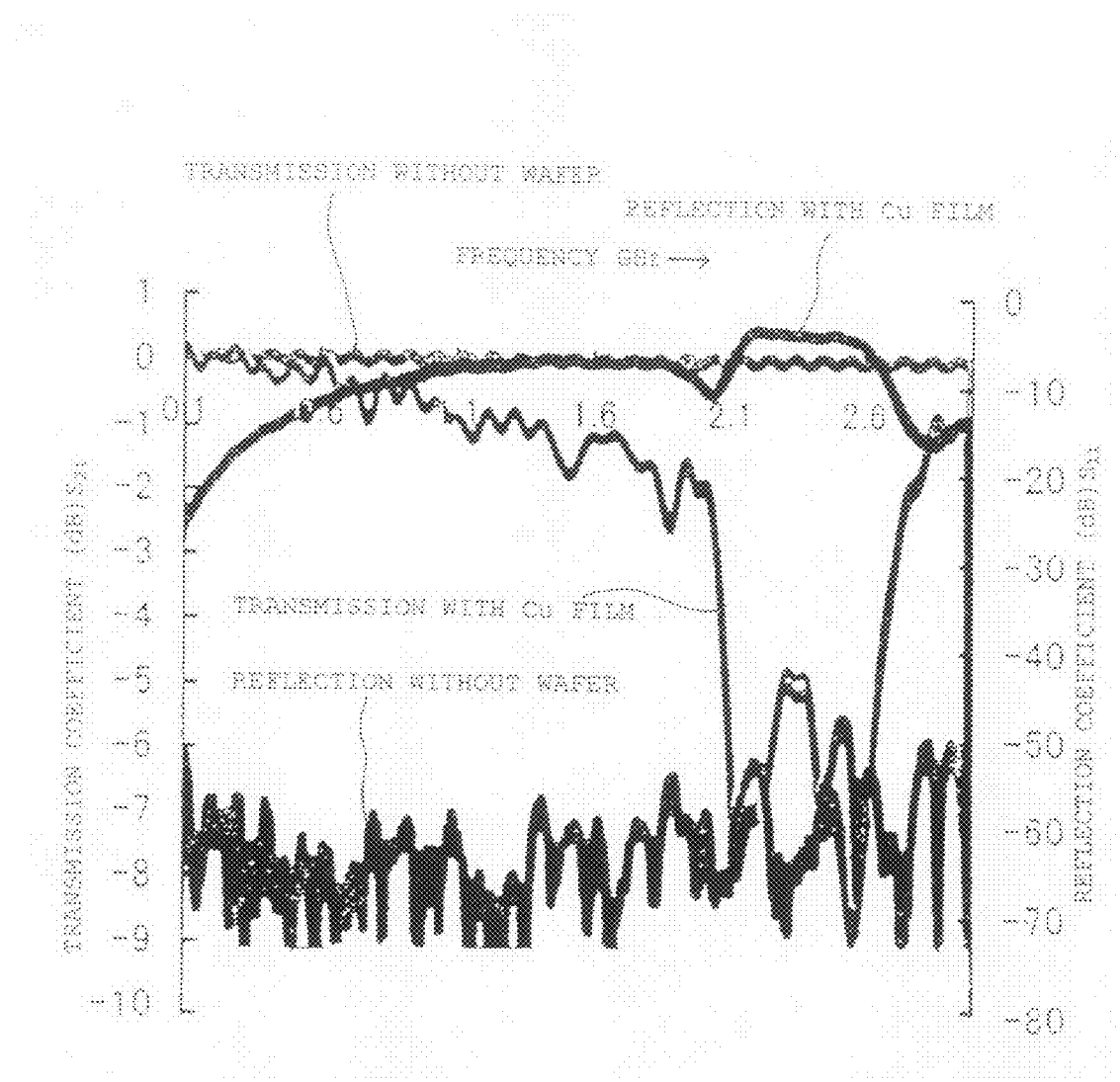
FIG. 4C shows characteristic variations of the transmission coefficient and the reflection coefficient as the frequency varies in the microwave band in the wafer having the conductive film, in a case where there is a wafer and a case where there is no wafer.

FIGS. 4A to 4C show examples of characteristic variations of the transmission coefficient $S_{21}$ and the reflection coefficient $S_{11}$ observed when the frequency in a microwave band of 0.1 to 3 GHz is continuously varied in a reference pattern wafer formed with a Cu film, a Ta film, a $SiO_2$ film, and a Si substrate. More specifically, FIG. 4A shows the characteristic variations observed in the Cu film as the uppermost layer. FIG. 4B shows the characteristic variations observed in the Ta film or the like after the Cu film is removed. FIG. 4C shows the characteristic variations in a case where the wafer exists in the opposite location of the microstrip line and in a case where the wafer does not exist in the opposite location of the microstrip line.

In a case where the Cu film or the like of the surface portion of the wafer W does not exist in the opposite location of the microstrip line 9, when electromagnetic waves of the frequency matching the characteristic impedance of the microstrip line 9 are supplied to the microstrip line 9, the transmission coefficient measured by the network analyzer 12 becomes almost 0 dB in the predetermined frequency range of 0.1 to 3 GHz, and most of the electromagnetic waves as the transmitted electromagnetic waves pass through the microstrip line 9, as indicated as the characteristics of the "transmission without wafer" in FIG. 4C. Accordingly, the reflection coefficient becomes approximately −65 dB, and the reflected electromagnetic waves that are reflected without passing through the microstrip line 9 hardly exist, as indicated as the characteristics of the "reflection without wafer" in FIG. 4C.

On the other hand, in a case where the Cu film or the like of the surface portion of the wafer W is placed in the opposite location of the microstrip line 9, the impedance of the transmission path becomes equal to the collective characteristic impedance of the microstrip line 9 and the conductive film of the Cu film and the likes, and the frequency band to be matched is changed. Accordingly, most of the electromagnetic waves in the frequency band matching only the characteristic impedance of the microstrip line 9 exhibit a reflection coefficient of approximately −7 dB, and are reflected without passing through the microstrip line 9, as indicated as the characteristics of the "reflection with Cu film" in FIG. 4A. Some of the electromagnetic waves as the surface current pass through the outermost layer of the Cu film in the region of the skin depth δ corresponding to the frequency of the electromagnetic waves. In FIG. 4A, the characteristics of the "transmission with Cu film" indicate the variation of the transmission coefficient due to the surface current.

Also, the characteristics of the "reflection after Cu film removal" and the "transmission after Cu film removal" in FIG. 4A indicate the variations of the reflection coefficient and the transmission coefficient after the Cu film is polished to have an extremely small film thickness defined by the skin depth 8, and the Cu film having the extremely small film thickness is removed by further polishing.

The variation of the reflection coefficient after the Cu film removal indicated as the characteristics of the "reflection after Cu film removal" in FIG. 4A substantially matches the variation of the reflection coefficient of the Ta film (below the Cu film) indicated as the characteristics of the "reflection with Ta film" in FIG. 4B.

The variation of the transmission coefficient after the Cu film removal indicated as the characteristics of the "transmission after Cu film removal" in FIG. 4A substantially matches the variation of the Ta film (below the Cu film) indicated as the characteristics of the "transmission with Ta film" in FIG. 4B.

As shown in FIGS. 4A and 4B, the characteristics of the "reflection with Cu film" and the characteristics of the "reflection after Cu film removal", which are the characteristics of the "reflection with Ta film", exhibit a large variation in a specific frequency area in the neighborhood of 2 to 2.8 GHz in the predetermined frequency range of 0.1 to 3 GHz. Likewise, the characteristics of the "transmission with Cu film" and the characteristics of the "transmission after Cu film removal", which are the characteristics of the "transmission with Ta film", exhibit a large variation in the specific frequency area in the neighborhood of 2 to 2.8 GHz.

With the above aspects being taken into consideration, the variation profiles of the reflection coefficient or the transmission coefficient measured in the predetermined frequency range are monitored, and the point where at least one of the reflection coefficient and the transmission coefficient measured in the specific frequency area with the particularly large variations exceeds a predetermined threshold value is detected as the end point of the polishing removal and the point equivalent to the end point of the polishing removal. In the characteristic variations shown in FIG. 4A, the characteristics of the "transmission with Cu film" are monitored, and the point where the transmission coefficient becomes as low as −4 dB, for example, at a frequency in the neighborhood of 2.1 GHz is detected as the end point of the polishing removal.

The conditions shown in Table 2 are examples of preferred polishing conditions for polishing and removing the Cu film.

TABLE 2

Slurry: CM7501/CM7552, manufactured by JSR Corporation
Additives: APS 4 wt %-APS, manufactured by ADEKA Corporation
Wafer: 300 mm
Wafer pressure: 3 psi
Retainer pressure: 3 psi
Platen rotating speed: 90 rpm
Wafer rotating speed: 90 rpm
Slurry flow rate: 300 cc/min
Polishing pad: foamed polyurethane (IC1400-XYGoove), manufactured by Nitta Haas Incorporated
Polishing time: approximately 1 min. stopped when the end point is detected
Pad dressing: dresser (4-inch disk, #100)
Dressing method: interval dressing, 1 min.

As for the variations of the transmission coefficient and the reflection coefficient measured at two frequencies of, for example, 2.2 GHz and 2.6 GHz within the specific frequency area of 2 to 2.8 GHz in FIG. 4A, at 2.2 GHz, the reflection coefficient represented by the characteristics of the "reflection with Cu film" is approximately −3, while the reflection coefficient represented by the characteristics of the "reflection after Cu film removal" is as low as approximately −9 dB. Also, at 2.2 GHz, the transmission coefficient represented by the characteristics of the "transmission with Cu film" is approximately −7.2 dB, while the transmission coefficient represented by the "transmission after Cu film removal" is as high as approximately −4 dB.

At 2.6 GHz, the reflection coefficient represented by the characteristics of the "reflection with Cu film" is approximately −5 dB, while the reflection coefficient represented by the characteristics of the "reflection after Cu film removal" is as low as approximately −15 dB. Also, at 2.6 GHz, the transmission coefficient represented by the characteristics of the "transmission with Cu film" is approximately −8 dB, while the transmission coefficient represented by the characteristics of the "transmission after Cu film removal" is as high as approximately −5.6 dB.

In this manner, at specific two frequencies within the predetermined frequency range, it is possible to obtain reflection coefficient variations and transmission coefficient variations that are sufficient to detect the end point of each polishing removal. Accordingly, the transmission coefficient and the reflection coefficient are measured at the two specific frequencies, and the end point of the polishing removal and the point equivalent to the end point of the polishing removal can also be detected when at least one of the measured transmission coefficient and reflection coefficient exceeds a predetermined reference variation value.

Also, at the two specific frequencies, the rate of change of the transmission coefficient and the rate of change of the reflection coefficient with respect to predetermined reference conditions are measured, and the end point of the polishing removal and the point equivalent to the end point of the polishing removal can also be detected when at least one of the measured rate of change of the transmission coefficient and the measured rate of change of the reflection coefficient exceeds a predetermined reference rate of change.

By the above described wafer polish monitoring method, the transmission coefficient and the reflection coefficient of the transmission path having the microstrip line 9 is used as the indexes for detecting the end point of each polishing removal. In the wafer W having conductive films and insulating films stacked on a Si substrate such as the above described structure formed with a Cu film, a Ta film, a $SiO_2$ film, and a Si substrate, the dielectric constant of the multilayer film as well as the variations of the transmission coefficient and the reflection coefficient vary with the variation of the film thickness after the thickness of the conductive film such as the Cu film decreases to the extremely thin film thickness defined by the skin depth $\delta$ as the polishing is performed. Further, the loss coefficient including the dielectric loss varies.

Accordingly, the dielectric constant and the loss coefficient as well as the transmission coefficient and the reflection coefficient are measured by the network analyzer 12, and the end point of each polishing removal may be detected, with at least one of the variations of the transmission coefficient, the reflection coefficient, the dielectric constant, and the loss coefficient being used as the index.

Figure 5A:
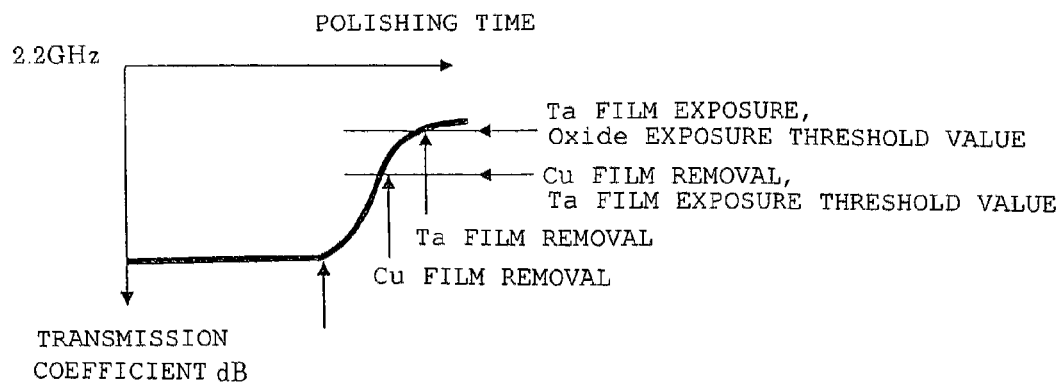
FIG. 5A illustrates an example of a method by which the end point of the polishing removal of the conductive film is detected based on the variation of the transmission coefficient.
Figure 5B:
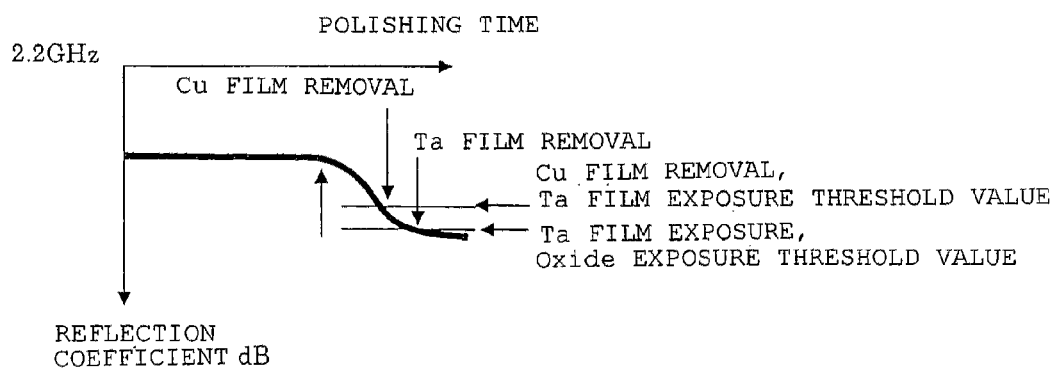
FIG. 5B illustrates an example of a method by which the end point of the polishing removal of the conductive film is detected based on the variation of the reflection coefficient.

By the method for detecting the end point of a polishing removal based on the transmission and reflection of electromagnetic waves in accordance with this embodiment, the end point of a polishing removal can be detected also in a wafer W having a regular oxide film, since the characteristic impedance slightly varies with the variation of the film thickness of the oxide film. FIG. 5A illustrates a method for detecting an end point from the variation of the transmission coefficient. FIG. 5B illustrates a method for detecting an end point from the variation of the reflection coefficient. In either of the cases, a threshold value for the point of time when the Cu film is removed and a threshold value for the point of time when the Ta film is removed can be set in accordance with the ratios between the film condition of the wafer W in advance and the indexes such as the transmission coefficient and reflection coefficients. During the polishing process, the endpoint of the Cu film removal can be detected when one of the threshold values is reached. Likewise, a threshold value may be set for the loss coefficient determined from the transmission and reflection coefficients, thereby the end point can be detected.

The end point may be set at the point where the Cu film or the Ta film is completely removed. In a case where there are characteristic changes in the waveforms of the transmission, reflection coefficients, and the likes before a point near the endpoint, the end point may be detected from the characteristic changes in the waveforms in advance, and the remaining polishing time can be empirically calculated. The polishing may be then continued until the end point, using the signal prior to the end point and additional polishing.

Examples of other various methods for detecting an end point include: a method by which an end point of a waveform variation is detected, and the detected end point is set as the end point of the polishing removal; a method by which an end point of a waveform variation is detected, and the end point of the polishing removal is set when a predetermined period of time has passed since the detected point; a method by which an inclination of a waveform change (a differential coefficient) is monitored, and the point where a predetermined differential coefficient is detected is set as the end point; and a method by which a predetermined differential coefficient is detected, and the end point is set when a predetermined period of time has passed since the detection of the predetermined differential coefficient.

By any of those methods, the endpoint of a polishing process cannot be precisely determined. However, those methods may be included in the end point detecting operations according to the present invention, since a specific polishing state prior to the end point is detected, and the end point is predicted based on the detected polishing state.

Figure 6:
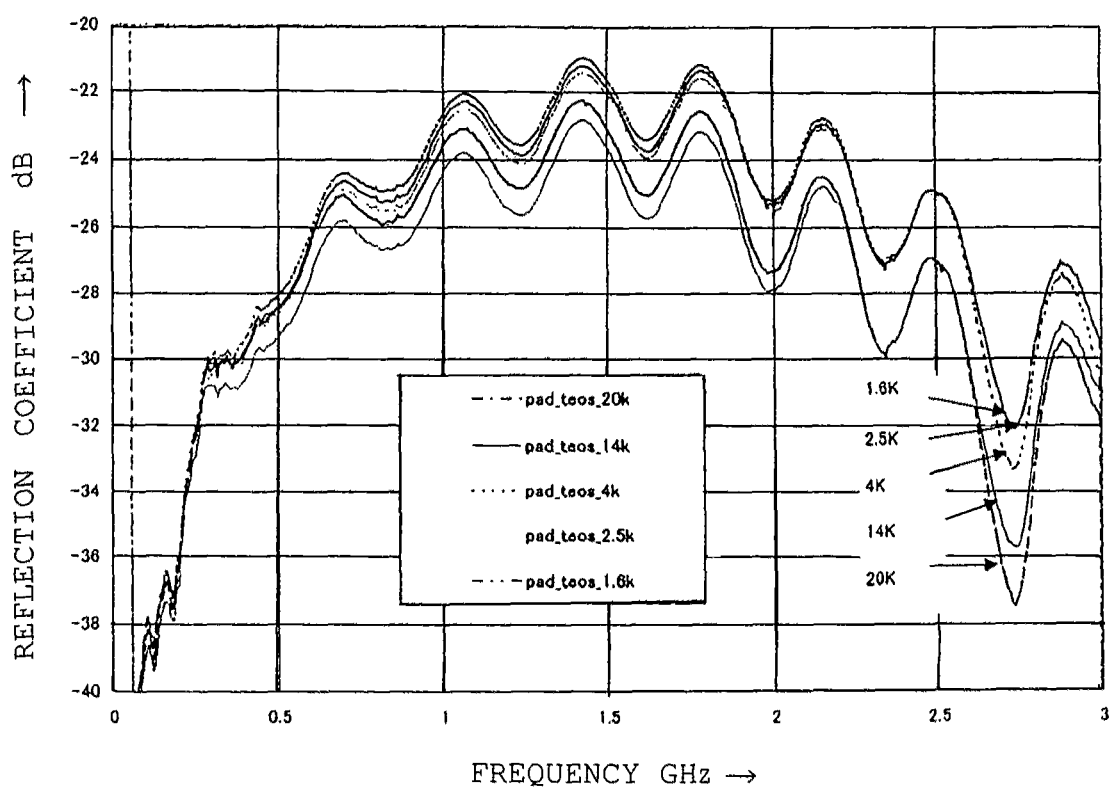
FIG. 6 shows an example of the variation of the reflection coefficient depending on the frequency in the oxide film.

Also, as already mentioned in the example cases of a Cu film, it has been found that transmission and reflection characteristics that vary with the thickness of an oxide film could be obtained in the same structure as above. FIG. 6 shows the reflection coefficient that varies with the thickness of an oxide film. Using the variation of the reflection coefficient, the end point can be detected in accordance with the film thickness of the oxide film, as in the case of a Cu film. More specifically, a relationship graph showing the relationship between the film thickness and the reflection coefficient at a certain frequency is created in advance, and a threshold value is set at a desired film thickness. When the threshold value is reached, the end point is detected, and the polishing is ended. This method is the same as the method utilized in the above-described cases of a Cu film, and therefore, explanation of the method is omitted here.

The conditions shown in Table 3 can be used as the preferred standard conditions for polishing an oxide film on a wafer W.

TABLE 3

| | |
|---|---|
| Slurry: SS12, manufactured by Cabot Corporation | Wafer: 300 mm |
| Wafer pressure: 4 psi | Platen rotating speed: 80 rpm |
| Retainer pressure: 2 psi | Wafer rotating speed: 80 rpm |
| Slurry flow rate: 300 cc/min | |
| Polishing pad: foamed polyurethane (IC1400-XYGoove), manufactured by Nitta Haas Incorporated | |
| Polishing time: approximately 1 min. stopped when the end point is detected | |
| Pad dressing: dresser (4-inch disk, #100) | |
| Dressing method: in-situ dressing | |

As described above, in the wafer polish monitoring method and the device in accordance with this embodiment, the transmission coefficient and the reflection coefficient of the transmission path having the microstrip line 9 greatly vary with the variation of the film thickness of the conductive film 8, after the film thickness of the conductive film 8 decreases to the extremely thin film thickness defined by the skin depth δ as the polishing is performed on the conductive film 8. Further, the dielectric constant and the loss coefficient including the dielectric loss also vary. Accordingly, based on the variation of at least one of the indexes including the transmission coefficient, the reflection coefficient, the dielectric constant, and the loss coefficient, the end point of the polishing removal of the conductive film 8 can be detected with high precision and accuracy, without adverse influence of the slurry or the like used in the polishing process.

The skin depth δ becomes extremely small in the frequency band of the microwave band. Accordingly, based on the variations of the indexes such as the transmission coefficient varying with the variation of the film thickness after the film thickness becomes as thin as the extremely small skin depth δ, the end point of the polishing removal of the conductive film 8 can be detected with higher precision and accuracy.

Since the high-frequency transmission path is formed with the microstrip line 9, the variations of indexes of the transmission characteristics and the likes of electromagnetic waves can be stably measured.

As the microstrip line 9 is buried in the upper face portion of the platen 2 of the chemical mechanical polishing device 1, variations of the indexes of the transmission characteristics and the likes of electromagnetic waves can be properly obtained, without adverse influence on the polishing removal of the conductive film 8.

The end point of the polishing removal of the conductive film 8 is detected based on the indexes such as the transmission coefficient measured at predetermined two frequencies in the microwave band. Accordingly, the end point of the polishing removal can be readily detected with high precision.

Figure 7:
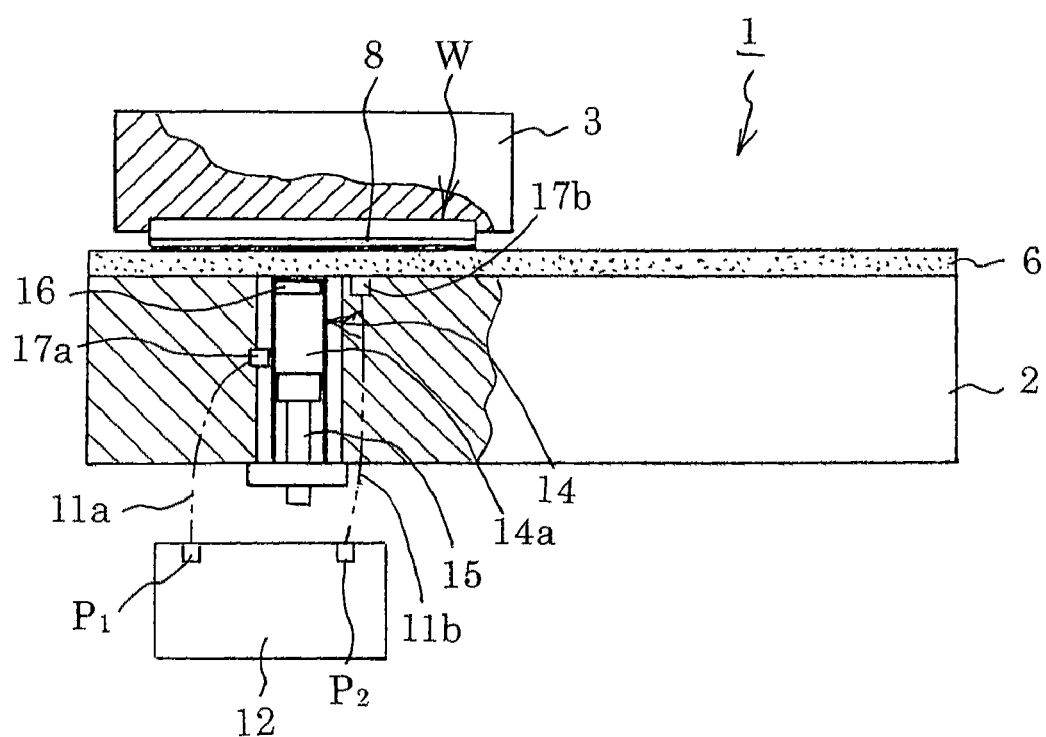
FIG. 7 is a partially cross-sectional side view of a structure in which a cavity resonator as another example of the high-frequency transmission path is incorporated into the platen.

Next, other example structures of the high-frequency transmission path are described. FIG. 7 shows a structure in which the high-frequency transmission path is formed with a cavity resonator 14, and the cavity resonator 14 is incorporated into the platen 2. In the cavity resonator 14, a cavity portion 14a has a cylindrical form, and the lower face of the cavity portion 14a is the upper face portion of a piston 15.

As the piston 15 is moved up and down, the volume of the cavity portion 14a is changed, and the resonant frequency of the cavity resonator 14 can be changed accordingly. As the resonant frequency of the cavity resonator 14 is changed, the collective characteristic impedance of the cavity resonator 14 and the film state of the wafer W is changed. Here, the characteristic impedance is preferably adjusted so that the transmission coefficient, the reflection coefficient, or the loss coefficient of electromagnetic waves varies markedly at the end point or near the end point of the polishing.

The upper face of the cavity portion 14a is covered with a nonconductor 16 such as quartz or Teflon (a registered trade name). As the nonconductor 16 serves as the upper face of the cavity portion 14a, electromagnetic waves are left open, passing through the upper face, in a case where the wafer W does not exist. In a case where a conductive film does not exist on the surface of the wafer W, the upper face of the cavity resonator 14 is left open, so that electromagnetic waves are radiated through the wafer W. In a case where a reflector of specific electromagnetic eaves are provided for the backside of the wafer W, and there are electromagnetic waves diverging through the wafer W, the radiation state should be made clear.

A first connecting portion 17a for guiding electromagnetic waves from the outside into the cavity portion 14a is provided below the cavity resonator 14, and a second connecting portion 17b for guiding electromagnetic waves from the cavity portion 14a to the outside is provided at a lower part and an upper part of the cavity resonator 14, respectively.

The first connecting portion 17a is connected to the port $P_1$ of the network analyzer 12 via the coaxial cable 11a and a rotational connecting means such as a slip ring (not shown). The second connecting portion 17b is connected to the port $P_2$ of the network analyzer 12 via the coaxial cable 11b and the same rotational connecting means as above (not shown).

Electromagnetic waves are then introduced from the network analyzer 12 into the cavity resonator 14 via the coaxial cable 11a and the first connecting portion 17a. The introduced electromagnetic waves are temporarily stored in the cavity resonator 14 and are amplified, so as to later act upon the conductive film 8 on the wafer W. Here, higher sensitivity can be obtained if a suitable hole is formed in the polishing pad 6 or a nonconductor 16 made of quartz of the like is placed near the wafer W.

In accordance with the impedance matching state based on the characteristic impedance formed by the state of the conductive film 8 on the surface of the wafer W and the cavity resonator 14, part of the electromagnetic waves introduced into the cavity resonator 14 are input as the transmitted electromagnetic waves to the port 22 of the network analyzer 12 from the second connecting portion 17b, and are then monitored. The electromagnetic waves that are not transmitted are input as the reflected electromagnetic waves to the port $P_1$ of the network analyzer 12 from the first connecting portion 17a, and are then monitored.

In the case where the network analyzer 12 is used, it is possible to monitor $S_{11}$ as the reflected electromagnetic waves, and $S_{21}$ as the transmitted electromagnetic waves, as described above. Without the network analyzer 12, transmitted and reflected electromagnetic wave outputs may be monitored, with the frequency of electromagnetic waves being fixed.

Figure 8:
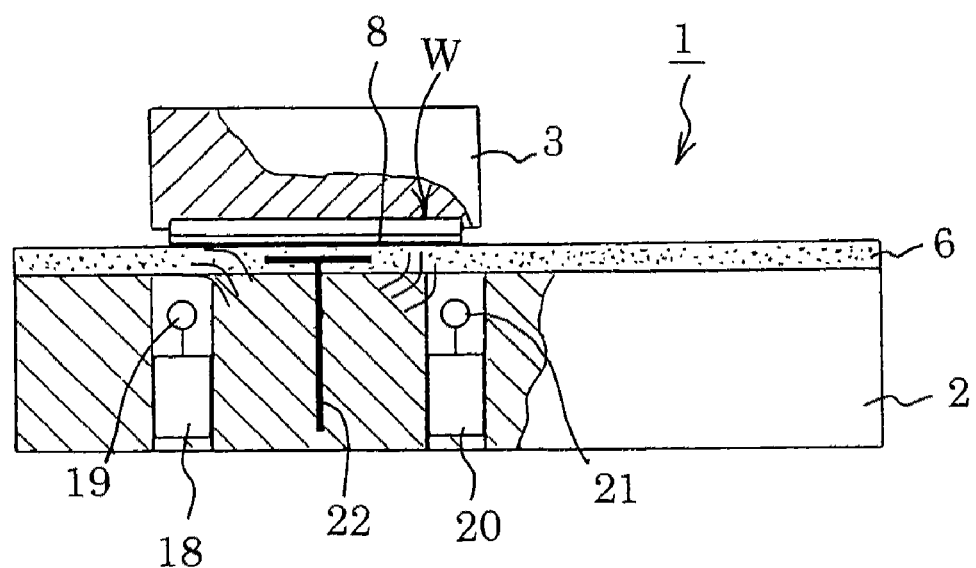
FIG. 8 is a partially cross-sectional side view of a structure in which a transmitter, a transmission antenna, a receiver, and a reception antenna that form yet another example of the high-frequency transmission path are incorporated into the platen.

FIG. 8 shows a structure in which the high-frequency transmission path is formed between a transmission antenna 19 connected to a transmitter 18 and a reception antenna 21 connected to a receiver 20, and the transmission antenna 19 connected to the transmitter 18 and the reception antenna 21 connected to the receiver 20 are incorporated into the platen 2. A metal isolation plate 22 having a T-like section is also provided between the transmission antenna 19 and the reception antenna 21, so that the high-frequency transmission path extending along the surface of the wafer W is efficiently formed between the metal isolation plate 22 and the wafer W.

In accordance with the state of the conductive film 8 on the surface of the wafer W, the characteristic impedance of the high-frequency transmission path varies, and the signal intensity on the side of the receiver 20 greatly varies. Based on this variation, the end point of the polishing removal of the conductive film 8 and the point equivalent to the end point of the polishing removal of the conductive film 8 are detected.

It should be noted that various changes and modifications may be made to the above embodiments, without departing from the scope of the invention, and the present invention of course concerns those changes and modifications.

What is claimed is:

1. A wafer polish monitoring method to be utilized in a processing device that carries out a flattening process while polishing and removing a conductive film on a surface of a wafer,
    the method comprising the steps of:
    forming a transmission path in a portion facing the surface of the wafer;
    placing a first electrode at an input terminal of the transmission path, and a second electrode at an output terminal of the transmission path;
    measuring one of S-parameters $S_{11}$ that is a reflection coefficient at the first electrode, and another one of the S-parameters $S_{21}$ that is a transmission coefficient at the second electrode seen from the first electrode;
    evaluating a polishing removal state of the conductive film based on at least one of $S_{11}$ and $S_{21}$; and
    detecting an end point of the polishing removal and a point equivalent to the end point of the polishing removal.

2. A wafer polish monitoring method to be utilized in a processing device that carries out a flattening process while polishing and removing a conductive film on a surface of a wafer,
    the method comprising the steps of:
    forming transmission path in a portion facing the surface of the wafer;
    measuring indexes including a transmission coefficient, a reflection coefficient, a dielectric constant, and a loss coefficient with respect to the transmission path;
    evaluating a polishing removal state of the conductive film based on at least one of the transmission coefficient, the reflection coefficient, the dielectric constant, and the loss coefficient; and
    detecting an end point of the polishing removal and a point equivalent to the end point of the polishing removal.

3. The wafer polish monitoring method according to claims 1 or 2, wherein a frequency band of electromagnetic waves to be supplied to the transmission path is a microwave band.

4. The wafer polish monitoring method according to claims 1 or 2, wherein:
    electromagnetic waves to be supplied to the transmission path are continuously varied within a predetermined frequency range; and
    a transmission coefficient equivalent to the transmitted electromagnetic waves and a reflection coefficient equivalent to the reflected electromagnetic waves are measured in the predetermined frequency range.

5. The wafer polish monitoring method according to claims 1 or 2, wherein the transmission path is formed with a microstrip line.

6. The wafer polish monitoring method according to claims 1 or 2, wherein:
    the processing device is a chemical mechanical polishing device; and
    the microstrip line is buried in an upper face portion of a platen of the chemical mechanical polishing device.

7. The wafer polish monitoring method according to claims 1 or 2, wherein:
    a short-circuited state, an open state, and a matched state of input and output terminals of the transmission path are set by a measurement system, and calibration is performed in advance; and
    the transmission coefficient and the reflection coefficient are measured on the transmission path after the calibration.

8. The wafer polish monitoring method according to claims 1 or 2, wherein the transmission path is formed between a transmission antenna connected to a transmitter and a reception antenna connected to a receiver.

9. The wafer polish monitoring method according to claims 1 or 2, wherein:
    profiles of the transmission coefficient and the reflection coefficient are monitored in the predetermined frequency range; and
    the end point of the polishing removal and the point equivalent to the endpoint of the polishing removal are detected when at least one of the transmission coefficient and the reflection coefficient exceeds a predetermined threshold value.

10. The wafer polish monitoring method according to claims 1 or 2, wherein:
    the transmission coefficient and the reflection coefficient are measured at predetermined two frequencies; and
    the end point of the polishing removal and the point equivalent to the end point of the polishing removal are detected when at least one of the measured values of the transmission coefficient and the reflection coefficient exceeds a predetermined reference condition.

11. The wafer polish monitoring method according to claims 1 or 2, wherein:
    a rate of change of the transmission coefficient and a rate of change of the reflection coefficient with respect to predetermined reference conditions are measured at predetermined two frequencies; and
    the end point of the polishing removal and the point equivalent to the end point of the polishing removal are detected when at least one of the measured rates of changes of the transmission coefficient and the reflection coefficient exceeds a predetermined reference rate of change.

* * * * *